(12) United States Patent
Fujii (10) Patent No.: US 12,494,754 B2
(45) Date of Patent: Dec. 9, 2025

(54) SYMMETRICAL COMMON GATE DIRECT CURRENT BIAS NETWORK FOR STACKED FIELD EFFECT TRANSMITTER DISTRIBUTED HIGH-POWER AMPLIFIER, RELATED APPARATUSES AND RELATED METHODS

(71) Applicant: MACOM Technology Solutions Holdings, Inc., Lowell, MA (US)

(72) Inventor: Kohei Fujii, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 566 days.

(21) Appl. No.: 17/967,915

(22) Filed: Oct. 18, 2022

(65) Prior Publication Data
US 2024/0128939 A1    Apr. 18, 2024

(51) Int. Cl.
*H03F 3/24*    (2006.01)
*H01P 3/08*    (2006.01)

(52) U.S. Cl.
CPC ............ *H03F 3/245* (2013.01); *H01P 3/081* (2013.01); *H03F 2200/451* (2013.01)

(58) Field of Classification Search
CPC ..... H03F 3/245; H03F 2200/451; H01P 3/081
USPC ........................................................ 330/297
See application file for complete search history.

(56) References Cited

U.S. PATENT DOCUMENTS

| | | | |
|---|---|---|---|
| 5,021,743 A * | 6/1991 | Chu | H03F 3/607 330/277 |
| 5,191,238 A | 3/1993 | Vasile | |
| 8,416,024 B2 | 4/2013 | Fujii | |
| 9,780,746 B1 * | 10/2017 | Fujii | H03F 3/195 |
| 2005/0093632 A1 | 5/2005 | Alenin | |
| 2023/0112435 A1 * | 4/2023 | Naseri Ali Abadi | H03F 3/245 330/311 |

FOREIGN PATENT DOCUMENTS

CN    106487342    3/2017

OTHER PUBLICATIONS

Benson, Kieth, "GaN breaks barrier-RF power amplifiers go wide and high", Analogue Dialogue, 51-09, Sep. 2017. (Year: 2017).*

* cited by examiner

*Primary Examiner* — Hafizur Rahman (57) ABSTRACT

A symmetrical common gate direct current bias network for stacked field effect transmitter distributed high-power amplifier, related apparatus, and related method are provided. An apparatus includes a plurality of amplifier stages connected in parallel between an input port and an output port. The apparatus can also include a first common gate voltage generator operatively connected at a first side of the plurality of amplifier stages and a second common gate voltage generator operatively connected at a second side of the plurality of amplifier stages. The first common gate voltage generator can be operatively connected to the second common gate voltage generator in a symmetrical configuration.

20 Claims, 6 Drawing Sheets

SYMMETRICAL COMMON GATE DIRECT CURRENT BIAS NETWORK FOR STACKED FIELD EFFECT TRANSMITTER DISTRIBUTED HIGH-POWER AMPLIFIER, RELATED APPARATUSES AND RELATED METHODS

TECHNICAL FIELD

The subject disclosure relates generally to electrical circuit design and, in particular, to distributed high power amplifiers, apparatuses, and methods related thereto.

BACKGROUND

In various microwave and millimeter wave (mm-wave) radio applications, broad high-power amplifier microwave monolithic integrated circuits (MMICs) are utilized. Such distributed high-power amplifiers (DHPA) can be used for many applications. To increase output power, multiple stacked field-effect transistors (FETs) are utilized. At high output power operation, direct current bias current to common gate FETs is significantly high and not negligible. This high common ate current generates voltage loss through the common gate voltage supply bus. As a result, asymmetrical gate voltage taper through the distributed FETs is generated.

It is noted that the above-described description is merely intended to provide a contextual overview of power amplifier design and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, provided is an apparatus that can include a plurality of amplifier stages connected in parallel between an input port and an output port. The apparatus can also include a first common gate voltage generator operatively connected at a first side of the plurality of amplifier stages and a second common gate voltage generator operatively connected at a second side of the plurality of amplifier stages. The first common gate voltage generator can be operatively connected to the second common gate voltage generator in a symmetrical configuration. in the symmetrical configuration, the first common gate voltage generator is operatively connected to the second common gate voltage generator via a circuit comprising a first radio frequency choke and a second radio frequency choke. Further to these implementations, the first radio frequency choke and the second radio frequency choke are operatively connected to a supply current. In accordance with some implementations, the first common gate voltage generator is operatively connected between a first radio frequency choke and a first capacitor. Further, the second common gate voltage generator is operatively connected between a second frequency choke and a second capacitor. Additionally, the first capacitor and the second capacitor are connected to an electrical ground. the plurality of amplifier stages are disposed on a monolithic microwave integrated circuit. In some implementations, the apparatus is part of a microwave or mm-wave power amplifier. Respective amplifier stages of the plurality of amplifier stages can include a set of field effect transistors. The set of field effect transistors can include a common source field effect transistor and at least two common gate field effect transistors operatively connected in series with a drain terminal of the common source field effect transistor. In an example, the set of field effect transistors are implemented in gallium arsenide (GaAs). In another example, the set of field effect transistors are implemented in gallium nitride (GaN). According to another example, the set of field effect transistors are implemented in indium phosphide (In F). In yet another example, the set of field effect transistors are implemented in a bipolar junction transistor (BJT). According to another example, the set of field effect transistors are implemented in heterojunction bipolar transistor (HBT). In another example, the set of field effect transistors are implemented in high electron mobility transistor (HEMT). In accordance with another example, the set of field effect transistors are implemented in pseudomorphic high electron mobility transistor (pHEMT) technologies. According to various implementations, the set of field effect transistors are implemented in combinations of the above examples. In some implementations, the common source field effect transistor and the at least two common gate field effect transistors are configured to form a cascode amplifier stage. In an example, respective amplifier stages of the plurality of amplifier stages are coupled using a microstrip line. In another example, respective amplifier stages of the plurality of amplifier stages are coupled using a coplanar wave guide structure. In one or more embodiments, a method can include operatively coupling a plurality of amplifier stages in parallel between an input port and an output port. The method can also include operatively connecting a first common gate voltage generator and a second common gate voltage generator in a symmetrical configuration. In an implementation, operatively connecting the first common gate voltage generator and the second common gate voltage generator can include connecting the first common gate voltage generator at a first side of the plurality of amplifier stages and connecting the second common gate voltage generator at a second side of the plurality of amplifier stages.

According to some implementations, operatively connecting the first common gate voltage generator and the second common gate voltage generator can include connecting the first common gate voltage generator to the second common gate voltage generator via a circuit comprising a first radio frequency choke and a second radio frequency choke. Further to these implementations, the method can include connecting the first radio frequency choke and the second radio frequency choke to a supply current.

In an alternative or additional implementation, the method can include connecting the first common gate voltage generator between a first radio frequency choke and a first capacitor. Further, the method can include connecting the second common gate voltage generator between a second frequency choke and a second capacitor. The method can also include connecting the first capacitor and the second capacitor to an electrical ground. According to some implementations, the method can include disposing of the plurality of amplifier stages on a monolithic microwave integrated circuit.

In an example, respective amplifier stages of the plurality of amplifier stages can include a set of field effect transistors that can include a common source field effect transistor and at least two common gate field effect transistors. Further to this example, the method can include coupling the common source field effect transistor and the at least two common gate field effect transistors in series with a drain terminal of the common source field effect transistor. In some implementations, the method can include configuring the common source field effect transistor and the at least two common gate field effect transistors to form a cascode amplifier stage.

The respective amplifier stages of the plurality of amplifier stages can be coupled via a microstrip line according to some implementations. In an additional, or alternative, implementation, the respective amplifier stages of the plurality of amplifier stages can be coupled via a coplanar wave guide structure.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Figure 1:
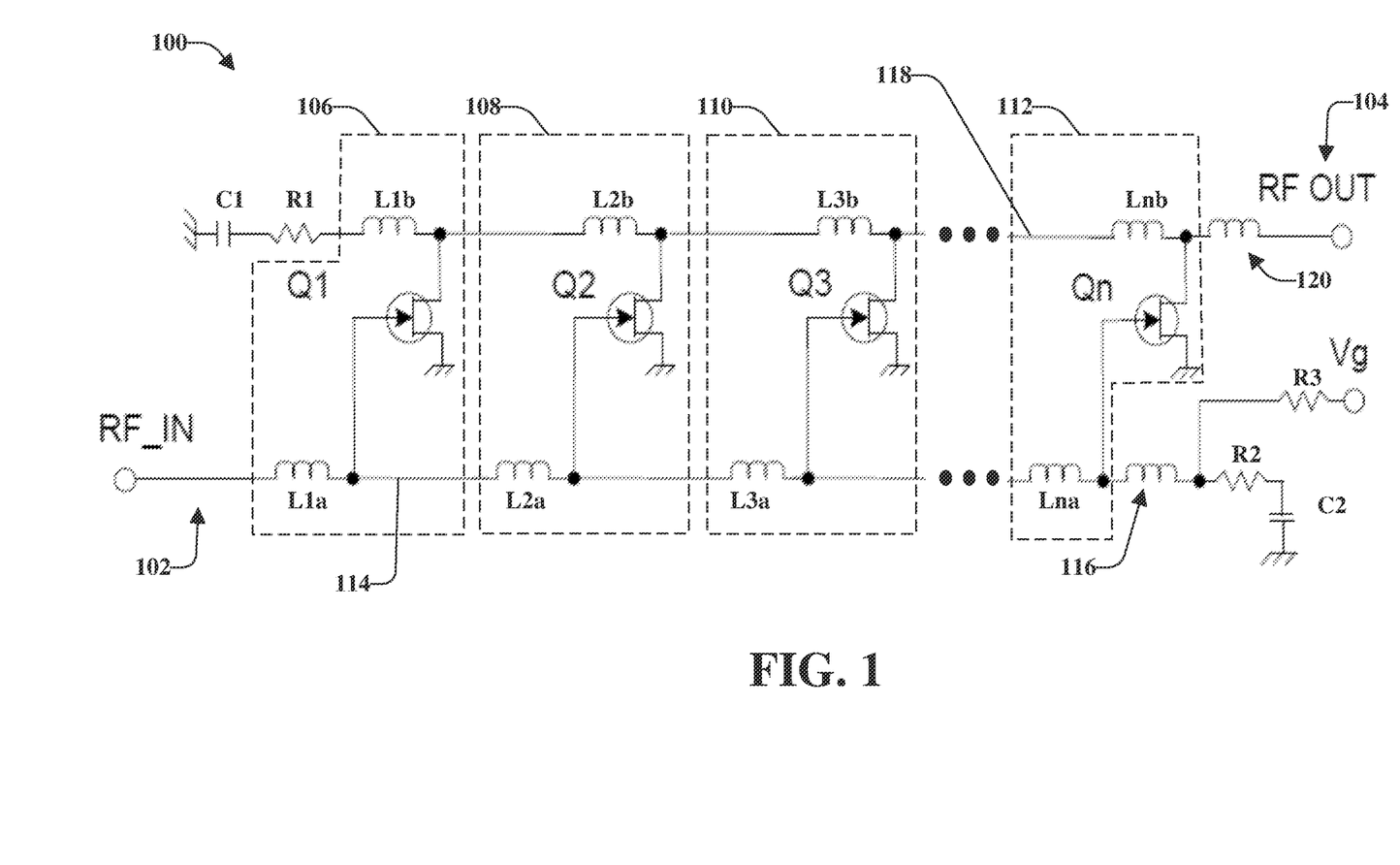
FIG. 1 illustrates an example, non-limiting, diagram of a circuit for a traditional distributed amplifier.

As mentioned, in various microwave and millimeter wave (mm-wave) radio applications, broad high-power amplifier microwave monolithic integrated circuits (MMICs) are utilized. Such distributed high-power amplifiers (DHPA) can be used for many applications. FIG. 1 illustrates an example, non-limiting, diagram of a circuit 100 for a traditional distributed amplifier (DA). The circuit 100 is an equivalent circuit for a traditional distributed amplifier (DA) MMIC. It is noted that the circuit 100 illustrated in FIG. 1 is a simplified circuit, as some components not necessary for understanding the circuit have been omitted for sake of brevity.

The circuit 100 includes an input port 102 and an output port 104. The circuit 100 also includes one or more stages (also referred to as sections). These stages are illustrated as a first stage 106, a second stage 108, a third stage 110, through an nth stage 112, where n is an integer. The various stages (e.g., the first stage 106, the second stage 108, the third stage 110, the nth stage 112) can be similar (or nearly identical) stages.

As illustrated, each stage includes a Field Effect Transistor (FET). The respective FETs are labeled as Q1 for the first stage 106; Q2 for the second stage 108; Q3 for the third stage 110; and Qn for the nth stage 112. In an example, the FET is a N channel Junction FET (J-FET or JFET), although another type of FET can be utilized. The respective FETs Q1, Q2, Q3, through Qn are arranged in a common source configuration.

Respective gate terminals of the respective FETs Q1, Q2, Q3, Qn are coupled to a gate transmission line 114. The gate transmission line 114 includes respective inductors L1a, L2a, L3a, through Lna. According to various implementations, the various impedances (e.g., via the inductors) of the gate transmission line can be implemented as a microstrip line, a coplanar wave guide structure, and so on. The gate transmission line 114 is configured to receive a Radio Frequency (RF) input signal (e.g., RF_IN).

The gate transmission line 114, coupled to the respective FETs Q1, Q2, Q3, Qn, is coupled to the RF input (RF_IN) of the circuit 100 via a terminal of the inductor L1a. The gate transmission line 114 is terminated at an inductor 116, which couples the gate transmission line 114 to a circuit ground potential (e.g., electrical ground) through a resistor R2 and a capacitor C2. A bias signal Vg is applied to the gate transmission line 114 through a resistor R3, which is coupled to the inductor 116 and the resistor R2.

The respective drain terminals of the respective FETs Q1, Q2, Q3, Qn are coupled to a drain transmission line 118. The drain transmission line 118 includes respective inductors L1b, L2b, L3b, through Lnb. According to various implementations, the various impedances (e.g., via the inductors) of the drain transmission line can be implemented using a microstrip line, a coplanar wave guide structure, and so on.

The drain transmission line 118 is terminated, at a first end at, in a resistor R1, which couples the drain transmission line 118 to a circuit ground potential (e.g., electrical ground) through a capacitor C1. The second end of the drain transmission line 118 is coupled to an RF output (e.g., RF_OUT) of the circuit 100 by an inductor 120. The output signal (RF_OUT) is, in some implementations, an amplified version of the input signal (RF_IN). For example, RF-OUT is equal to K times RF_IN (RF_OUT=K*RF_IN), where K represents a gain of the circuit 100.

Figure 2:
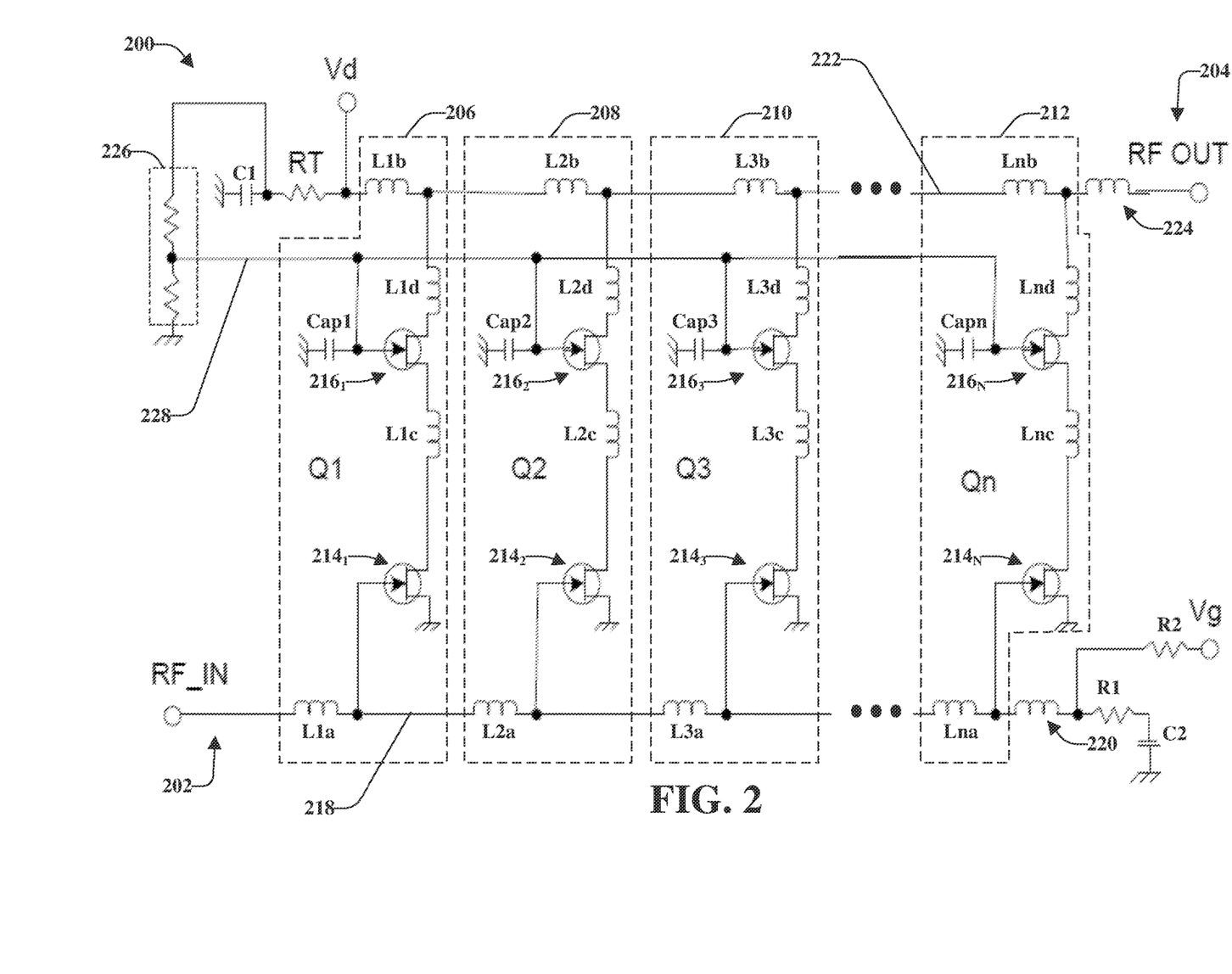
FIG. 2 illustrates an example, non-limiting, diagram of a circuit for a two-stacked distributed amplifier.

A distributed amplifier that includes the circuit 100 has a low power output level. To increase the output power level, stacked FETs can be utilized. FIG. 2 illustrates an example, non-limiting, diagram of a circuit 200 for a two-stacked distributed amplifier (DA). Repetitive description of like elements employed in other embodiments described herein is omitted for sake of brevity.

Specifically, FIG. 2 illustrates an equivalent circuit for a traditional two-stacked FET distributed high performance architecture (DHPA) MMIC. It is noted that the circuit 200 illustrated in FIG. 2 is a simplified circuit, as some components not necessary for understanding the circuit have been omitted for sake of brevity.

As illustrated, the circuit 200 includes an input port 202 and an output port 204. The circuit 200 also includes one or more stages (also referred to as sections, cells, or cascode distributed), indicated as a first stage 206, a second stage 208, a third stage 210, through an nth stage 212, where n is an integer.

The respective stages (e.g., the first stage 206, the second stage 208, the third stage 210, the nth stage 212) include respective first FETs $214_1$, $214_2$, $214_3$, through $214_n$ and respective second FETs $216_1$, $216_2$, $216_3$, through $216_n$. The first FETs $214_1$, $214_2$, $214_3$, $214_n$ are arranged in a common source configuration. The second FETs $216_1$, $216_2$, $216_3$, $216_n$ are arranged in a common gate configuration.

Respective gate terminals of the first FETs $214_1$, $214_2$, $214_3$, $214_n$ are coupled to a gate transmission line 218. The gate transmission line 218 includes respective inductors L1a, L2a, L3a, through Lna. According to various implementations, impedances (e.g., the inductors) of the gate transmission line 218 can be implemented using a microstrip line, a coplanar wave guide structure, and so on. The gate transmission line 218 is configured to receive a Radio Frequency (RF) input signal (e.g., RF_IN).

The gate transmission line 218, coupled to the respective first FETs $214_1$, $214_2$, $214_3$, $214_n$, is coupled to the RF input (RF_IN) of the circuit 200 via a terminal of the inductor L1a. The gate transmission line 218 is terminated at an inductor 220, which couples the gate transmission line 218 to a circuit ground potential (e.g., electrical ground) through a resistor R1 and a capacitor C2. A bias signal Vg is applied to the gate transmission line through a resistor R2, which is coupled to the inductor 220 and the resistor R1.

Respective drain terminals of the second FETs $216_1$, $216_2$, $216_3$, $216_n$ are coupled to a drain transmission line 222. The drain transmission line 22 includes respective inductors L1b, L2b, L3b, through Lnb. According to various implementations, the drain transmission line can be implemented as a microstrip line, a coplanar wave guide structure, and so on.

The drain transmission line 222 is terminated, at a first end, in a resistor RT, which couples the drain transmission line 222 to the circuit ground potential through a capacitor C1. A supply DC voltage (Vd) for the stacked FET DH PA is applied between the resistor RT and the inductor L1b of the drain transmission line 222.

The second end of the drain transmission line 222 is coupled to an RF output (e.g., RF_OUT) of the circuit 200 by an inductor 224. The output signal (RF_OUT) is, in some implementations, an amplified version of the input signal (RF_IN). For example, RF-OUT is equal to K times RF_IN (RF_OUT=K*RF_IN), where K represents a gain of the circuit 300.

Respective drain terminals of the first FETs $214_1$, $214_2$, $214_3$, $214_n$ are coupled to respective source terminals of the second FETs $216_1$, $216_2$, $216_3$, $216_n$ via respective inductors L1c, L2c, L3c, through Lnc. Respective gate terminals of the second FETs $216_1$, $216_2$, $216_3$, $216_n$ are DC coupled respective reference potential and AC coupled to the circuit ground potential by respective decoupling capacitors cap1, cap2, cap3, through capn. Further, respective drain terminals of the second FETs $216_1$, $216_2$, $216_3$, $216_n$ are coupled to the drain transmission line 222 via respective inductors L1d, L2d, L3d, through Lnd.

A common gate voltage generator 226 is coupled, at a first end, to the resistor RT and the capacitor C1. A second end of the common gate voltage generator 226 is coupled to the circuit ground potential. Further, a common gate voltage supply bus 228 of the common gate voltage generator 226 is coupled to the respective decoupling capacitors cap1, cap2, cap3, capn and respective gate terminals of the second FETs $216_1$, $216_2$, $216_3$, $216_n$.

The utilization of two FETs in each section for the FET DHPA MMIC increases the power as compared to the circuit 100 of FIG. 1. For example, the circuit 200 includes additional transistors (e.g., the second FETs $216_1$, $216_2$, $216_3$, $216_n$) for each section that are stacked in order to double the operational voltage (as compared to the circuit 100 of FIG. 1). Accordingly, the circuit 200 is configured to output more power as compared to circuit 100.

For the stacked FET operation (e.g., the circuit 200), a common gate FET (e.g., the respective second FETs $216_1$, $216_2$, $216_3$, $216_n$) that is on top of the common source FET (e.g., the respective first FETs $214_1$, $214_2$, $214_3$, $214_n$) uses the common gate DC bias voltage. The common gate DC bias voltage for the two-stacked FET is set according to the following equation:

$$Vg\_cg = Vd/2 - Vg.$$

In the above equation, Vd is the supply DC voltage for the stacked FET DHPA. Vg is the gate DC bias voltage for the common source FET. For generating the common gate DC bias voltage Vg_cg, a common gate DC voltage generator (e.g., the common gate voltage generator 226) is integrated in the DHPA. The common gate voltage generator can be placed as close as possible to the termination resistor RT. However, at high output power operation, DC bias current to the common gate FETs is significantly high and not negligible. This high common gate current generates the voltage loss through the common gate voltage supply bus. As a result, asymmetrical gate voltage taper through the distributed FETs Q1, Q2, Q3 . . . Qn is generated.

Figure 3:
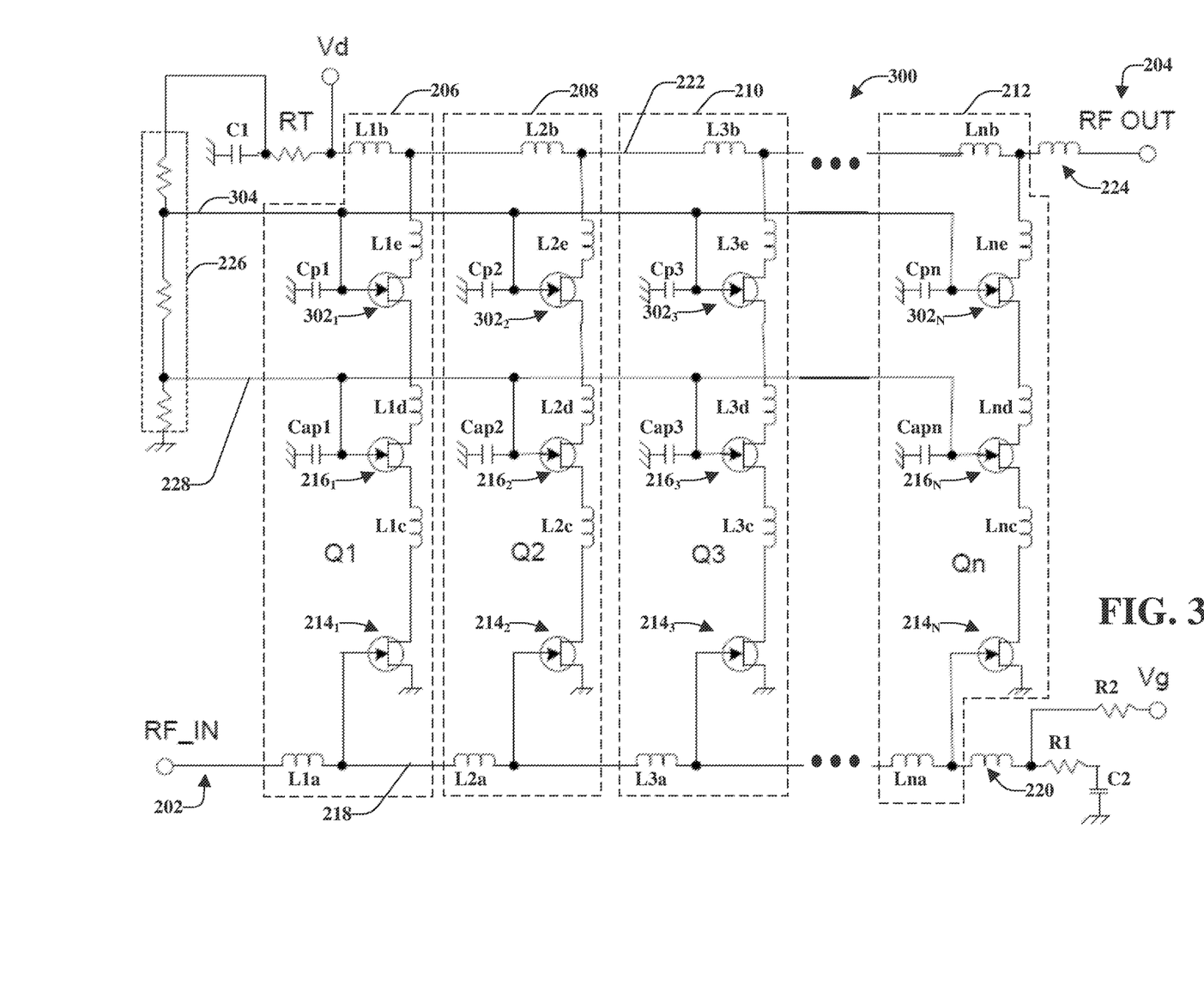
FIG. 3 illustrates an example, non-limiting, diagram of a circuit for a three-stacked distributed amplifier.

FIG. 3 illustrates an example, non-limiting, diagram of a circuit 300 for a three-stacked distributed amplifier (DA). Repetitive description of like elements employed in other embodiments described herein is omitted for sake of brevity. Specifically, FIG. 3 illustrates an equivalent circuit for a traditional three-stacked FET DHPA MMIC. It is noted that the circuit 300 illustrated in FIG. 3 is a simplified circuit, as some components not necessary for understanding the circuit have been omitted for sake of brevity.

The circuit 300 of FIG. 3 is similar to the circuit 200 of FIG. 2. Accordingly, similar components will not be described again for purposes of simplicity. The following will describe the differences between the circuit 200 and the circuit 300.

The circuit 300 includes respective third FETs, indicated as third FETs $302_1$, $302_2$, $302_3$, through $302_n$. The third FETs $302_1$, $302_2$, $302_3$, $302_n$ are arranged in a common gate configuration.

In the circuit 300, the respective drain terminals of the second FETs $216_1$, $216_2$, $216_3$, $216_n$ are operatively coupled to respective source terminals of the third FETs $302_1$, $302_2$, $302_3$, $302_n$ via respective inductors L1d, L2d, L3d, through Lnd. Respective gate terminals of the third FETs $302_1$, $302_2$, $302_3$, $302_n$ are coupled to the circuit ground potential by respective decoupling capacitors Cp1, Cp2, Cp3, through Cpn. Further, respective drain terminals of the third FETs $302_1$, $302_2$, $302_3$, $302_n$ are coupled to the drain transmission line 222 via respective inductors L1e, L2e, L3e, through Lne. Additionally, another common gate voltage supply bus 304 of the common gate voltage generator 226 is coupled to the respective decoupling capacitors Cp1, Cp2, Cp3, Cpn and respective gate terminals of the third FETs $302_1$, $302_2$, $302_3$, $302_n$.

Due to the asymmetrical common gate voltage taper at high peak RF output power, designated common gate voltages cannot be maintained, particularly at near RF at output port Qn. This unwanted voltage shift degrades output power performance significantly. In a worst case scenario, FETs that are located close to the RF output port are significantly damaged as the self-distraction manner.

Provided herein are various embodiments that enable the distribution of the common gate voltage evenly through Q1 to Qn. According to the disclosed embodiments, much higher output power DHPA MMICs can be designed without reliability concerns. Further details are provided below.

Figure 4:
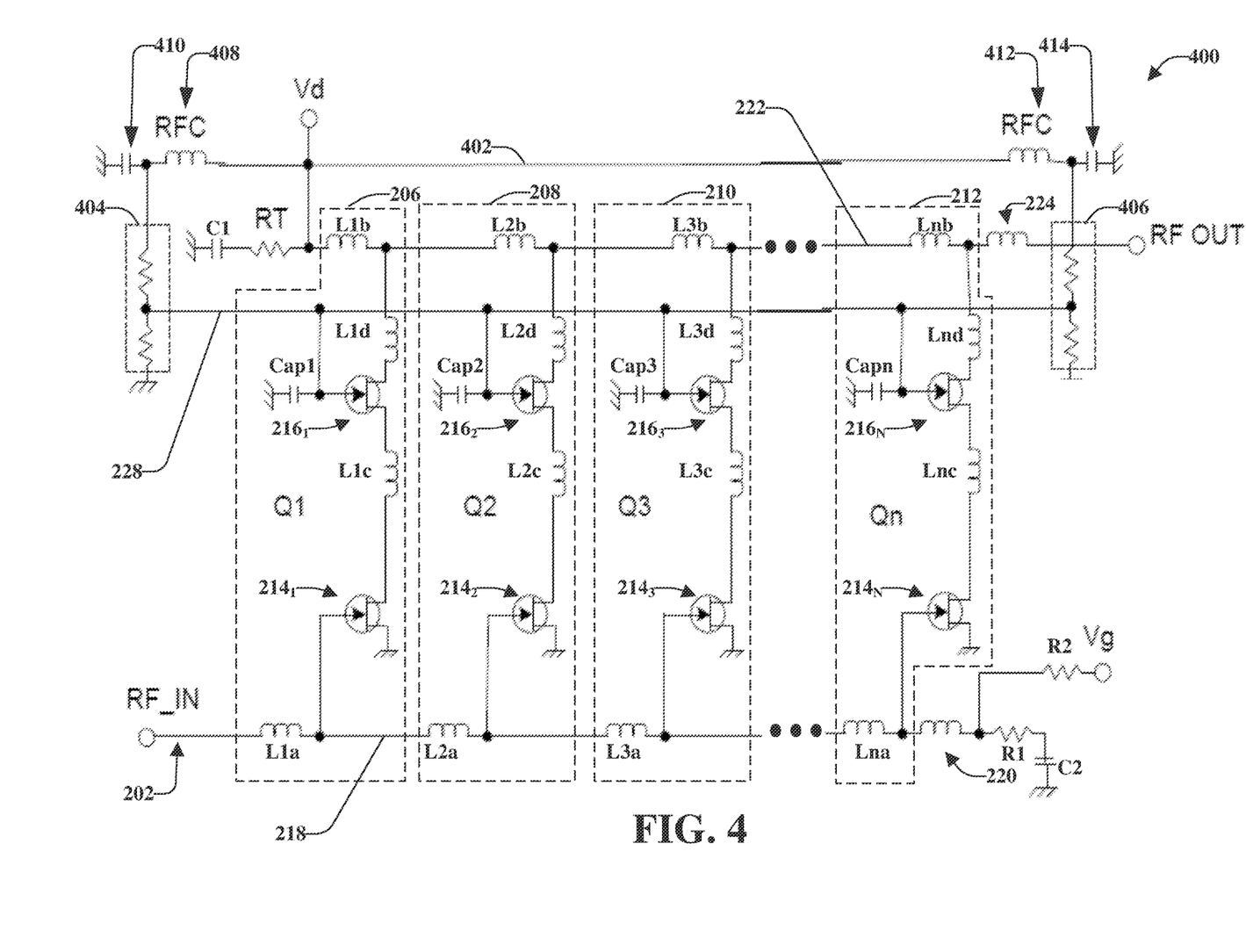
FIG. 4 illustrates an example, non-limiting, circuit that utilizes a symmetrical common gate direct current bias network in accordance with one or more embodiments described herein.

FIG. 4 illustrates an example, non-limiting, circuit 400 that utilizes a symmetrical common gate direct current bias network in accordance with one or more embodiments described herein. Repetitive description of like elements employed in other embodiments described herein is omitted for sake of brevity. It is noted that circuit 400 is similar to circuit 200. Therefore, similar components will not be described for purposes of simplicity.

The circuit 400 is an equivalent circuit for a stacked FET DHPA MMIC with a symmetrical common gate DC bias network. The circuit 400 includes a symmetrical common gate DC bias network 402. The symmetrical common gate DC bias network 402 includes two common gate voltage generators, identified as a first common gate voltage generator 404 and a second common gate voltage generator 406.

To integrate the two common gate voltage generators, respective RF chokes (RFCs) and by-passing capacitor networks are included in the symmetrical common gate DC bias network 402 of the circuit 400. A first side of the first common gate voltage generator 404 is operatively connected to the symmetrical common gate DC bias network 402 at a first side of a first RFC 408 and a first side of a capacitor 410. A second side of the capacitor 410 is connected to the circuit ground potential (e.g., electrical ground). The second side of the first RFC 408 is connected to the supply DC voltage Vd supply port, which is operatively connected to the drain transmission line 222 between the resistor RT and the inductor L1*b*.

Further, a first side of the second common gate voltage generator 406 is operatively connected to the symmetrical common gate DC bias network 402 at a first side of a second RFC 412 and a first side of a capacitor 414. A second side of the capacitor 414 is connected to the circuit ground potential (e.g., electrical ground). The second side of the second RFC 412 is connected to the supply DC voltage Vd supply port.

Figure 5:
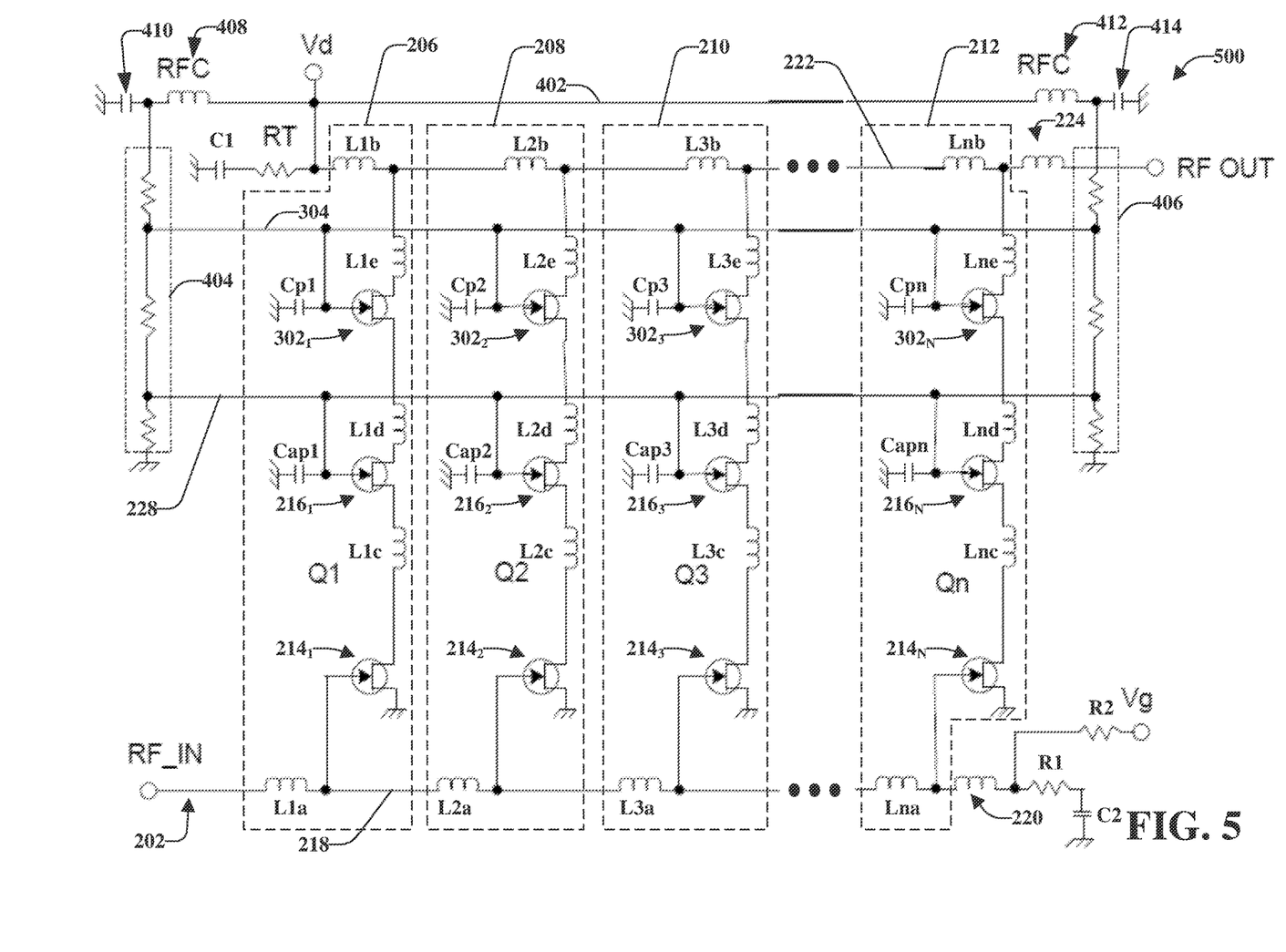
FIG. 5 illustrates another example, non-limiting, circuit that utilizes a symmetrical common gate direct current bias network in accordance with one or more embodiments described herein.

FIG. 5 illustrates another example, non-limiting, circuit 500 that utilizes a symmetrical common gate direct current bias network in accordance with one or more embodiments described herein. Repetitive description of like elements employed in other embodiments described herein is omitted for sake of brevity. It is noted that circuit 500 is similar to circuit 300. Therefore, similar components will not be described for purposes of simplicity.

The circuit 500 is an equivalent circuit for a three-stacked FET DHPA MMIC with a symmetrical common gate DC bias network. The circuit 500 includes the symmetrical common gate DC bias network 402. The symmetrical common gate DC bias network 402 includes the two common gate voltage generators, identified as a first common gate voltage generator 404 and a second common gate voltage generator 406. To integrate the two common gate voltage generators, respective RF chokes (RFCs) and by-passing capacitor networks are included in the symmetrical common gate DC bias network 402 of the circuit 500.

A first side of the first common gate voltage generator 404 is operatively connected to the symmetrical common gate DC bias network 402 at a first side of a first RFC 408 and a first side of a capacitor 410. A second side of the capacitor 410 is connected to the circuit ground potential (e.g., electrical ground). The second side of the first RFC 408 is connected to the supply DC voltage Vd supply port, which is operatively connected to the drain transmission line 222 between the resistor RT and the inductor L1*b*.

Further, a first side of the second common gate voltage generator 406 is operatively connected to the symmetrical common gate DC bias network 402 at a first side of a second RFC 412 and a first side of a capacitor 414. A second side of the capacitor 414 is connected to the circuit ground potential (e.g., electrical ground). The second side of the second RFC 412 is connected to the supply DC voltage Vd supply port.

Although discussed with respect to two common gate voltage generators, various implementations can utilize three or more common gate voltage generators. The number of common gate voltage generators to be utilized can be determined based on the number of stacked FETs. Such determination can be made based on a voltage slope between the common gate voltage generators. As the slope increases, there can be a corresponding need for more common gate voltage generators. For example, one or more simulations can be conducted and based on the measured delta, considerations to include in the respective circuit (or apparatus) a third, fourth, or more common gate voltage generators can be made.

In the implementations of the circuit 400 of FIG. 4 and the circuit 500 of FIG. 5, the various FETs (e.g., Q1, Q2, Q3, Qn) can receive the same gate voltages. In contrast, FETs (e.g., Q1, Q2, Q3, Qn) of the circuit 200 of FIG. 2 and the circuit 300 of FIG. 3, the FETs can receive different gate voltages due to the asymmetrical configuration (e.g., only one common gate voltage generator).

The disclosed embodiments can include a plurality of amplifier stages that are disposed on a monolithic microwave integrated circuit. Further, the disclosed embodiments can be included as a part of a microwave or mm-wave power amplifier. In some implementations, the common source FET and the two common gate FETs of each stage can form a cascode amplifier stage.

In various embodiments, the FETs can be implemented in gallium arsenide (GaAs), gallium nitride (GaN), indium phosphide (InP), bipolar junction transistor (BJT), heterojunction bipolar transistor (HBT), high electron mobility transistor (HEMT), and pseudomorphic high electron mobility transistor (pHEMT) technologies, or combinations thereof. However, other semiconductor technologies can be utilized to meet the design criteria of a particular application.

In some implementations, one or more of the transistors (e.g., the FETs) in the amplifier stage can be coupled using a microstrip line. Alternatively, or additionally, one or more of the transistors (e.g., the FETs) in the amplifier stage can be coupled using a coplanar wave guide structure.

According to some implementations, the amplifier stages can be coupled using a microstrip line. Alternatively, or additionally, the amplifier stages can be coupled using a coplanar wave guide structure.

In the circuit 200 of FIG. 2 and the circuit 300 of FIG. 3, the common gate voltage generator 226 is connected to the ground terminal of the termination resistor RT. This configuration is due to the RF signal isolation requirement between drain and gate. Therefore, circuit 200 and the circuit 300 is not able to place the common gate voltage generator 226 in a symmetrical configuration, as is provided with circuit 400 of FIG. 4 and circuit 500 of FIG. 5. To integrate two or more common gate voltage generators (e.g., the first common gate voltage generator 404, the second common gate voltage generator 406), RF choke and by-passing capacitor network (e.g., the circuit 400 (e.g., the first RFC 408/capacitor 410 pair, the second RFC 412/capacitor 414 pair)) are placed in between the Vd supply port (Vd) and the common gate voltage generators. The RFC with by-passing capacitor network enables a high RF signal isolation between drain and gate without losing symmetrical configuration. This DHPA configuration enables the generation identical common gate voltage to Q1 through Qn. Since the disclosed embodiments facilitate the ability to distribute common gate voltage evenly through Q1 to Qn, much higher output power DHPA MMICs can be designed without reliability concerns.

Methods that can be implemented in accordance with the disclosed subject matter will be better appreciated with reference to the above flow charts. While, for purposes of simplicity of explanation, the methods are shown and described as a series of acts or blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g., device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 6:
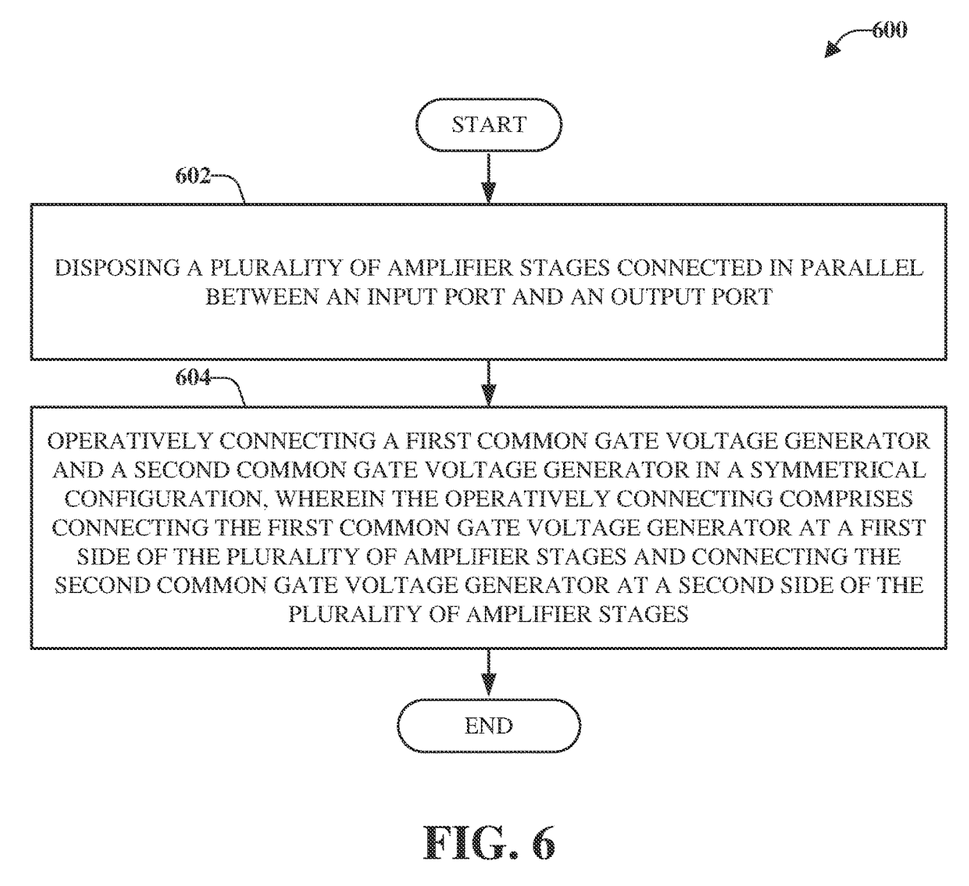
FIG. 6 illustrates an example, non-limiting, method for fabricating a distributed amplifier in accordance with one or more embodiments described herein.

FIG. 6 illustrates an example, non-limiting, method 600 for fabricating a distributed amplifier in accordance with one or more embodiments described herein.

The method 600 starts at 602 with operatively coupling a plurality of amplifier stages in parallel between an input port and an output port. Further, at 604 the method 600 operatively connects a first common gate voltage generator and a second common gate voltage generator in a symmetrical configuration. In an implementation, operatively connecting the first common gate voltage generator and the second common gate voltage generator can include connecting the first common gate voltage generator at a first side of the plurality of amplifier stages and connecting the second common gate voltage generator at a second side of the plurality of amplifier stages.

According to some implementations, operatively connecting the first common gate voltage generator and the second common gate voltage generator can include connecting the first common gate voltage generator to the second common gate voltage generator via a circuit comprising a first radio frequency choke and a second radio frequency choke. Further, to these implementations, the method 600 can include connecting the first radio frequency choke and the second radio frequency choke to a supply current.

In an alternative or additional implementation, the method 600 can include connecting the first common gate voltage generator between a first radio frequency choke and a first capacitor. Further, the method 600 can include connecting the second common gate voltage generator between a first second frequency choke and a second capacitor. The method 600 can also include connecting the first capacitor and the second capacitor to an electrical ground.

According to some implementations, the method can include disposing of the plurality of amplifier stages on a monolithic microwave integrated circuit.

In an example, respective amplifier stages of the plurality of amplifier stages comprise a set of field effect transistors comprising a common source field effect transistor and at least two common gate field effect transistors. Further to this example, the method 600 can include coupling the common source field effect transistor and the at least two common gate field effect transistors in series with a drain terminal of the common source field effect transistor. In some implementations, the method 600 can include configuring the common source field effect transistor and the at least two common gate field effect transistors to form a cascode amplifier stage.

The respective amplifier stages of the plurality of amplifier stages can be coupled via a microstrip line according to some implementations. In an additional, or alternative, implementation, the respective amplifier stages of the plurality of amplifier stages can be coupled via a coplanar wave guide structure.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Other than in the operating examples, if any, or where otherwise indicated, all numbers, values and/or expressions referring to parameters, measurements, conditions, etc., used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An apparatus, comprising:
a plurality of amplifier stages connected in parallel between an input port and an output port;
a first common gate voltage generator operatively connected at a first side of the plurality of amplifier stages; and
a second common gate voltage generator operatively connected at a second side of the plurality of amplifier stages,
wherein the first common gate voltage generator is operatively connected to the second common gate voltage generator in a symmetrical configuration.

2. The apparatus of claim 1, wherein, in the symmetrical configuration, the first common gate voltage generator is operatively coupled to the second common gate voltage generator via a circuit comprising a first radio frequency choke and a second radio frequency choke.

3. The apparatus of claim 2, wherein the first radio frequency choke and the second radio frequency choke are operatively connected to a supply current.

4. The apparatus of claim 1, wherein the first common gate voltage generator is operatively connected between a first radio frequency choke and a first capacitor, wherein the second common gate voltage generator is operatively connected between a second frequency choke and a second capacitor, and wherein the first capacitor and the second capacitor are connected to an electrical ground.

5. The apparatus of claim 1, wherein the plurality of amplifier stages are disposed on a monolithic microwave integrated circuit.

6. The apparatus of claim 1, wherein the apparatus is part of a microwave or mm-wave power amplifier.

7. The apparatus of claim 1, wherein respective amplifier stages of the plurality of amplifier stages comprise a set of field effect transistors comprising:
   a common source field effect transistor; and
   at least two common gate field effect transistors operatively connected in series with a drain terminal of the common source field effect transistor.

8. The apparatus of claim 7, wherein the set of field effect transistors are implemented in at least one or of gallium arsenide (GaAs), gallium nitride (GaN), indium phosphide (InP), bipolar junction transistor (BJT), heterojunction bipolar transistor (HBT), high electron mobility transistor (HEMT), pseudomorphic high electron mobility transistor (pHEMT) technologies, or combinations thereof.

9. The apparatus of claim 7, wherein the common source field effect transistor and the at least two common gate field effect transistors are configured to form a cascode amplifier stage.

10. The apparatus of claim 1, wherein respective amplifier stages of the plurality of amplifier stages are coupled using a microstrip line.

11. The apparatus of claim 1, wherein respective amplifier stages of the plurality of amplifier stages are coupled using a coplanar wave guide structure.

12. A method, comprising:
   operatively coupling a plurality of amplifier stages in parallel between an input port and an output port; and
   operatively connecting a first common gate voltage generator and a second common gate voltage generator in a symmetrical configuration,
   wherein the operatively connecting comprises connecting the first common gate voltage generator at a first side of the plurality of amplifier stages and connecting the second common gate voltage generator at a second side of the plurality of amplifier stages.

13. The method of claim 12, further comprising:
   coupling the first common gate voltage generator to the second common gate voltage generator via a circuit comprising a first radio frequency choke and a second radio frequency choke.

14. The method of claim 13, further comprising:
   connecting the first radio frequency choke and the second radio frequency choke to a supply current.

15. The method of claim 12, further comprising:
   connecting the first common gate voltage generator between a first radio frequency choke and a first capacitor;
   connecting the second common gate voltage generator between a second frequency choke and a second capacitor; and
   connecting the first capacitor and the second capacitor to an electrical ground.

16. The method of claim 12, further comprising:
   disposing of the plurality of amplifier stages on a monolithic microwave integrated circuit.

17. The method of claim 12, wherein respective amplifier stages of the plurality of amplifier stages comprise a set of field effect transistors comprising a common source field effect transistor and at least two common gate field effect transistors, and wherein the method further comprises:
   coupling the common source field effect transistor and the at least two common gate field effect transistors in series with a drain terminal of the common source field effect transistor.

18. The method of claim 17, further comprising:
   configuring the common source field effect transistor and the at least two common gate field effect transistors to form a cascode amplifier stage.

19. The method of claim 12, further comprising:
   coupling the respective amplifier stages of the plurality of amplifier stages via a microstrip line.

20. The method of claim 12, further comprising:
   coupling the respective amplifier stages of the plurality of amplifier stages via a coplanar wave guide structure.

* * * * *